(12) United States Patent
Mongia

(10) Patent No.: US 7,559,210 B2
(45) Date of Patent: Jul. 14, 2009

(54) METHOD AND APPARATUS FOR COOLING A HEAT SOURCE

(75) Inventor: Rajiv K. Mongia, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 396 days.

(21) Appl. No.: 11/171,884

(22) Filed: Jun. 29, 2005

(65) Prior Publication Data

US 2007/0000269 A1  Jan. 4, 2007

(51) Int. Cl.
*F25D 23/12*  (2006.01)
(52) U.S. Cl. ...................... 62/259.2; 62/498
(58) Field of Classification Search .............. 62/259.2, 62/498, 515
See application file for complete search history.

(56) References Cited

U.S. PATENT DOCUMENTS

| 4,653,282 | A  |   | 3/1987  | Gueneau |
| 6,393,851 | B1 |   | 5/2002  | Wightman |
| 6,446,450 | B1 |   | 9/2002  | Pressler |
| 6,718,781 | B2 |   | 4/2004  | Freund et al. |
| 6,748,755 | B2 |   | 6/2004  | Kubo et al. |
| 6,845,625 | B1 | * | 1/2005  | Pokharna ................... 62/118 |
| 2006/0101831 | A1 | * | 5/2006  | Storm et al. ................. 62/3.7 |
| 2006/0279706 | A1 | * | 12/2006 | Bash et al. ................... 353/54 |

OTHER PUBLICATIONS

Wood et al., "Increasing the Energy Efficiency of Domestic Air Conditioners, Refrigerators and Freezers," Domestic Use of Electrical Energy Conference 1999, pp. 141-145.

* cited by examiner

*Primary Examiner*—Melvin Jones
(74) *Attorney, Agent, or Firm*—Schwabe, Williamson & Wyatt, P.C.

(57) ABSTRACT

An evaporator thermally coupled with a heat source is operated in manner with the coolant exiting the evaporator in a less than fully vaporous state. For an embodiment, the exiting coolant may be brought to at least a substantially vaporous state by being thermally coupled to a compressor.

17 Claims, 3 Drawing Sheets

200

210
PROVIDE COOLANT TO AN EVAPORATOR THERMALLY COUPLED WITH A HEAT SOURCE

220
THERMALLY COUPLE LESS THAN FULLY VAPORIZED COOLANT TO COMPRESSOR

230
PROVIDE THE COMPRESSOR WITH AT LEAST SUBSTANTIALLY VAPORIZED COOLANT FOR COMPRESSION

Fig. 2

METHOD AND APPARATUS FOR COOLING A HEAT SOURCE

TECHNICAL FIELD

Embodiments of the present invention relate to, but are not limited to, the field of cooling, in particular, to the cooling of electronic devices, such as integrated circuits. More specifically, embodiments of the present invention relate to the under employment of an evaporator, and/or heating a cooling medium to at least full vaporization prior to compression.

BACKGROUND

The current trend in electronics is to make electronic devices with smaller components operating at higher clock frequencies and power levels generating more and more heat. These components include electronic packages such as microprocessor and memory packages. The electronic packages typically include a die that is usually mounted onto a supporting substrate sometimes referred to as a carrier or package substrate ("substrate"). The electronic package, in turn, is usually physically and electrically coupled to a printed circuit board (PCB). The die and the substrate are commonly made of multiple ceramic or silicon layers. The heat generated by such electronic packages can increase to high levels. One approach to draw the heat away from the die includes the use of vapor cooling subsystem in thermal contact with the die. Such vapor cooling subsystem typically includes an evaporator operating such that the fluid leaving the evaporator is at a fully vaporized state, which is in turn provided to a compressor of the subsystem. The approach has the advantage of preventing liquid (non-vaporous droplets of coolant) slugging of a compressor, which could lead to earlier failure of the compressor. However, experience has shown that such approach might not be most effective from a heat transfer perspective.

BRIEF DESCRIPTION OF DRAWINGS

The present invention will be described by way of exemplary embodiments, but not limitations, illustrated in the accompanying drawings in which like references denote similar elements, and in which:

FIG. 2 illustrates a flow diagram of a method of cooling, in accordance with one embodiment of the invention.

DETAILED DESCRIPTION OF ILLUSTRATIVE EMBODIMENTS

In the following description, for purposes of explanation, numerous details are set forth in order to provide a thorough understanding of the disclosed embodiments of the present invention. However, it will be apparent to one skilled in the art that these specific details are not required in order to practice the disclosed embodiments of the present invention.

The following description may include terms such as on, onto, on top, underneath, underlying, downward, lateral, and the like, that are used for descriptive purposes only and are not to be construed as limiting. That is, these terms are terms that are relative only to a point of reference and are not meant to be interpreted as limitations but are instead included in the following description to facilitate understanding of the various aspects of the invention.

The phrase "in one embodiment" is used repeatedly. The phrase generally does not refer to the same embodiment; however, it may.

The terms "comprising", "having" and "including" are synonymous, unless the context dictates otherwise.

The term "fully vaporous", when used in context of a gas/vapor, describe a gas just at, or just beyond its saturation temperature/state, unless the context dictates otherwise.

The terms "superheating" and "superheat", when used in context of a gas/vapor, describe a gas with a temperature higher than its saturation temperature, unless the context dictates otherwise.

Further, various operations will be described as multiple discrete operations, in turn, in a manner that is most helpful in understanding the present invention; however, the order of description should not be construed as to imply that these operations are necessarily order dependent. In particular, these operations need not be performed in the order of presentation. In addition, one or more of the operations may be eliminated while other operations may be added in different embodiments of the invention.

Figure 1:
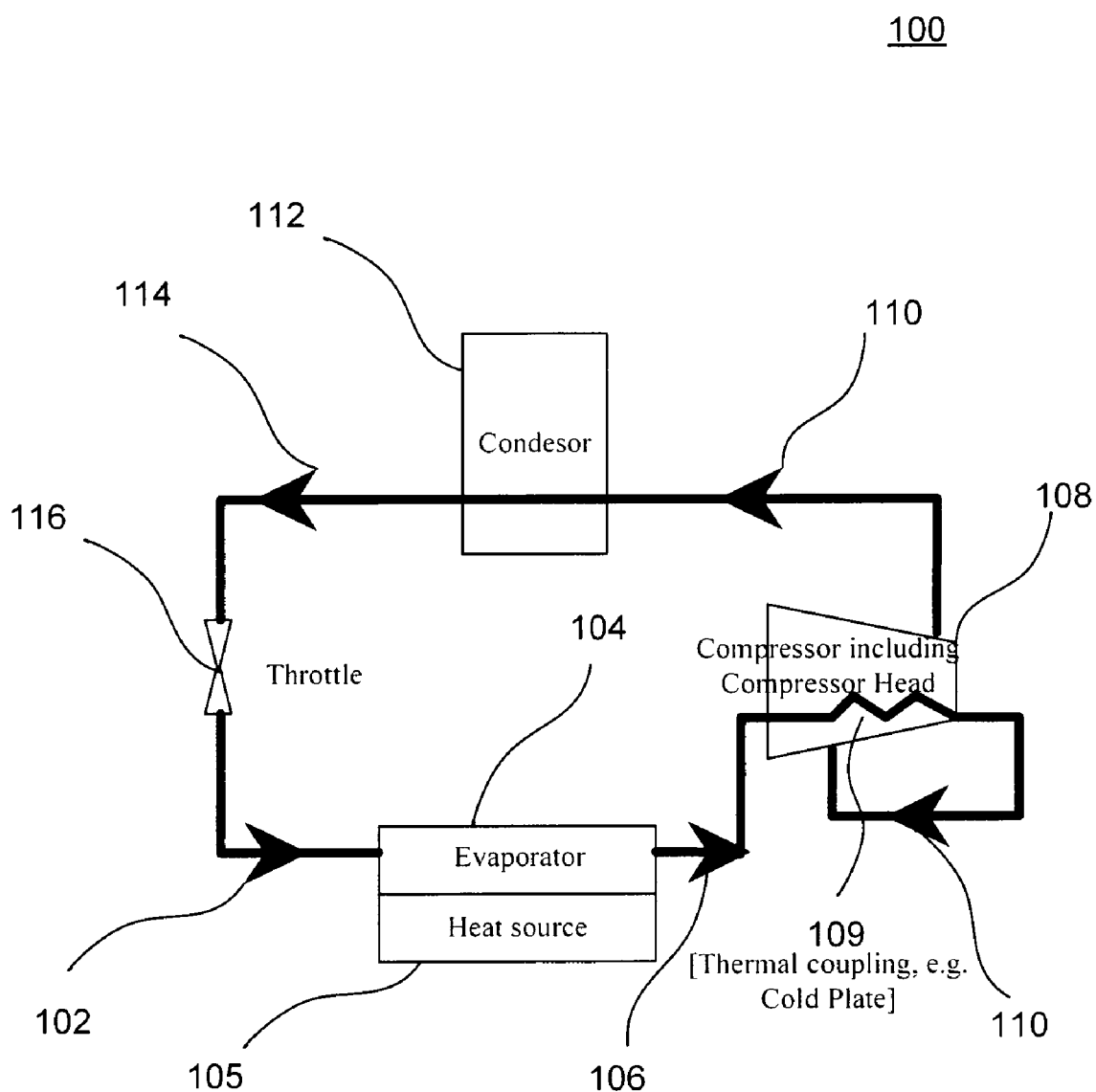
FIG. 1 illustrates a block diagram of a cooling system, in accordance with one embodiment of the invention.

FIG. 1 illustrates a block diagram of a cooling apparatus 100, according to one embodiment. Coolant 102 is supplied to an evaporator 104. For the embodiments, the evaporator 104 is configurable to be operated in a manner that allows the coolant to leave the evaporator 104 as a liquid-vapor mixture. This may decrease the thermal dynamic efficiency of the cooling apparatus, but it may increase the thermal transfer capacity of the cooling apparatus. By operating the evaporator 104 such that the fluid leaving is a mixture of liquid and vapor, the cooling efficiency of the heat source 105, for some embodiments, may be enhanced. For various embodiments, approximately 3 percent by weight (or more) of the exiting coolant 106 remains in the non-vaporous (liquid) state. For another embodiment, between approximately 3 to approximately 20 percents of the exiting coolant 106 remains in the non-vaporous state. In yet another embodiment, between approximately 5 to 15 percents of the exiting coolant 106 remains in the non-vaporous state. In another embodiment, 10 percent of the exiting coolant 106 remains in the non-vaporous state.

To assist in preventing coolant 106 exiting the evaporator 104 slugging of a compressor 108 with non-vaporous droplets of coolant, the compressor 108 is configurable to allow thermal coupling 109 of exiting coolant 106, for various embodiments. The thermal coupling 109 allows the heat generated by the compressor 108 to heat the exiting coolant 106 to a substantially fully vaporous state 110. The droplets may cause blades (not shown) or other components (not shown) in the compressor 108 to wear, thus potentially decreasing the life and efficiency of the compressor 108. Moreover, such slugging can interfere with the ability of the compressor 108 to achieve pressure.

For some embodiments, the thermal coupling 109 of the exiting coolant 106 with the compressor 108 may include one or more thermal couplings with one or more portions of a portion of a compressor head of the compressor (not shown), a portion of a compressor motor (not shown) of the compressor 108, or combinations thereof. The thermal coupling 109, for an embodiment, may employ the use of a cold plate (not shown) attached to, or part of the compressor 108. Then, the coolant 106 exiting the evaporator 104 may be routed through the cold plate. The cold plate need not be a planar surface, but can take any number of shapes including a jacket or sleeve that complementarily attaches to or is integral to the compressor 108. For an embodiment, the coolant after being heated by the compressor 108 is in a super heated state and becomes fully vaporized prior to entry into the compressor 108 for compression.

For an embodiment, a superheated, compressed coolant 110 is propelled from the compressor 108. The coolant 110 may then be routed to a condenser 112. The condenser may then cool the coolant 110 and condense it to a liquid (or substantially liquid) coolant 114. From the condenser, the coolant 114 can be routed through a throttle 116, or thermostatic expansion valve. The throttle 116, for an embodiment, can control the flow rate of the coolant 102 entering the evaporator 104. The dynamic interaction between the heat of the coolant 102, pressure of the coolant 102 entering the evaporator, and the amount of heat transferred from the heat source 105 to the evaporator 104, may determine the amount of coolant remaining in the non-vaporous state upon exit of the evaporator 104.

For various embodiments, an integrated circuit, (e.g., a processor, graphics processor, memory, etc), may be the heat source 105. For another embodiment, a hard drive may be the heat source 105. For another embodiment, there may be multiple heat sources 105.

FIG. 2 illustrates a flow diagram of a suitable method of cooling a heat source as illustrated in FIG. 1, in accordance with one embodiment of the invention.

At process point 210, coolant is provided to an evaporator coupled to a heat source, for the embodiments. The heat source may be, for example, an integrated circuit (such as a processor, memory, etc.) or a peripheral device, such as a hard drive or a power supply, according to various embodiments.

In various embodiments, the evaporator is operated in such a manner that the coolant does not fully vaporize upon exiting. For one embodiment, more than approximately 3 percent of the coolant by weight remains in the non-vaporous state upon exiting. In another embodiment, approximately 3 percent to approximately 20 percent remains in the non-vaporous state upon exiting. For yet another embodiment, approximately 5 percent to approximately 15 percent remains in the non-vaporous state upon exiting the evaporator.

Next, for the embodiments, at 220, the exiting coolant is brought from the less than fully vaporous state to at least a substantially fully vaporous state. For an embodiment, the substantially fully vaporous state, the exiting coolant is at a superheated state. A compressor may be used according to some embodiments to bring the coolant from the less than fully vaporous state to the substantially fully vaporous state. Additionally, since the coolant exiting the evaporator may be cooler, in some cases substantially cooler, than the compressor, the compressor may be cooled at the same time the coolant is being heated. This may increase the efficiency and potentially the life of the compressor and at least some of its constituent parts. To use the compressor in such a manner, for an embodiment the compressor is thermally coupled to the coolant. For some embodiments, not all of the compressor need be thermally coupled. Rather, just a compressor head, or perhaps the compressor motor may be thermally coupled. However, for an embodiment, at least some portion of both the compressor head and the compressor motor are thermally coupled to the coolant exiting the evaporator in order to cool the compressor and cause the state change from less than to substantially fully vaporous for the coolant.

Next, for some embodiments, at 230, the coolant at the at least substantially fully vaporous state (or superheated state for other embodiments) is routed to the compressor for compression. The cycle is then repeated with the compressed coolant eventually being provided from the compressor back to the evaporator (usually through a condenser and a throttle), according to an embodiment.

The operations described above with respect to the methods illustrated in FIG. 2 can be performed with components other than those listed. For example, it will be understood by those of ordinary skill in the art that 230 could provide a condenser with the compressed coolant prior to 210 receiving the coolant. Additionally, sensors and logic may be connected to the system to maintain the appropriate level of evaporator flooding and control of the compressor.

The above-described choice of components, geometry, temperatures, pressures, and assembly can all be varied by one of ordinary skill in the art to optimize the thermal performance of the package, depending on the specific application, and selected operational and reliability characteristics.

The particular implementation of the IC package is flexible in terms of the orientation, size, number, and composition of its constituent elements. Various embodiments of the invention can be implemented using various combinations of substrate technology, IFS technology, thermal interface material, and sealant to achieve the advantages of the present disclosure. The structure, including types of materials used, dimensions, layout, geometry, and so forth, of the IC package can be built in a wide variety of embodiments, depending upon the requirements of the electronic assembly of which it forms a part.

Figure 3:
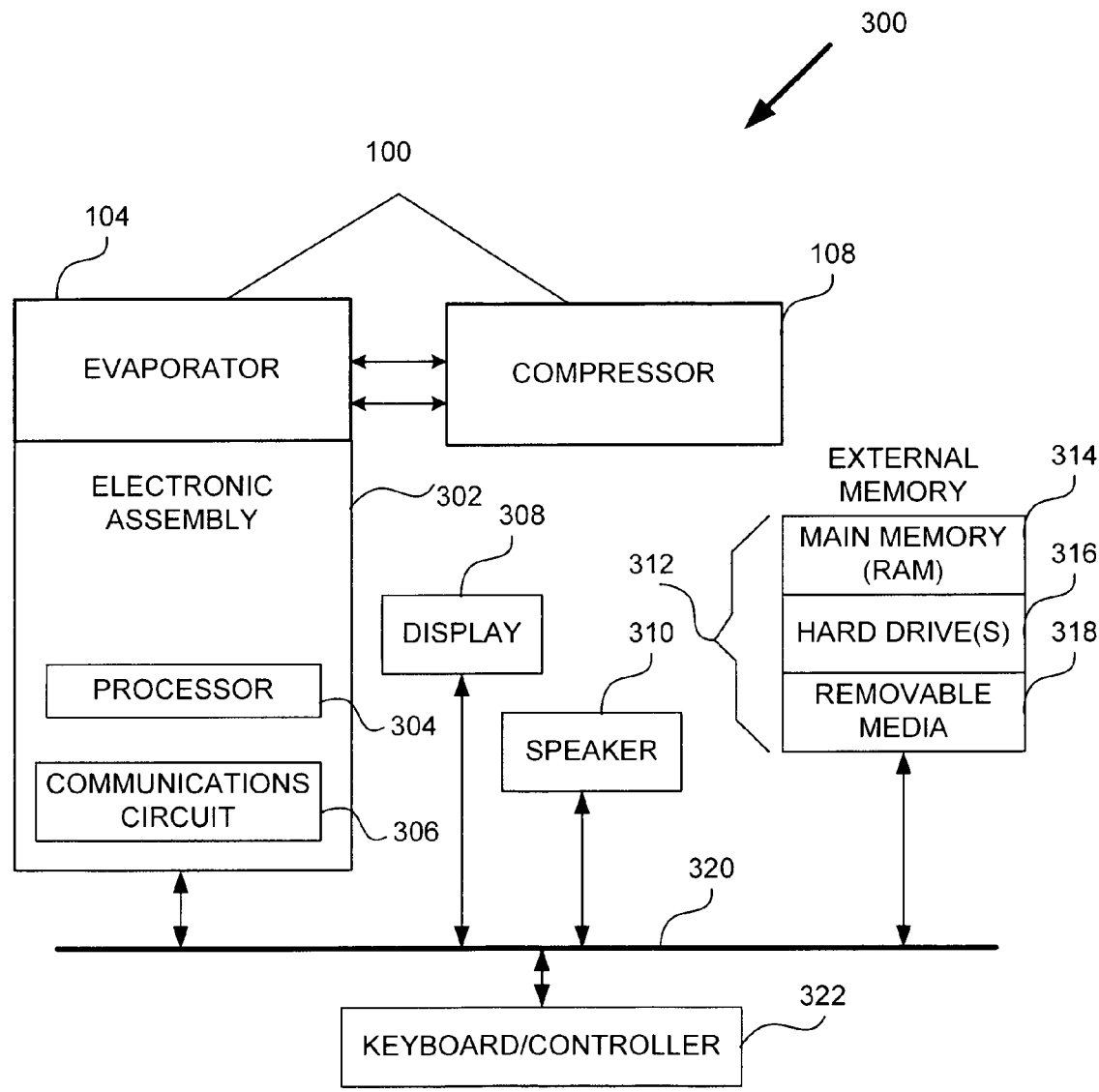
FIG. 3 is a block diagram of an electronic system incorporating at least one cooling system, in accordance with one embodiment of the invention.

FIG. 3 illustrates a system 300 incorporating at least one electronic assembly 302 with the evaporator 104 with coolant thermally coupling a compressor 108 of the cooling apparatus 100 of FIG. 1 in accordance with one embodiment of the invention. This electronic assembly 302 may have a processor 304 and/or communications circuit 306. The system 300 may further include external memory 312 which, in turn, can have a main memory 314 in the form of random access memory (RAM), one or more hard drives 316, and/or one or more drives that can use removable media 318, for example, floppy diskettes, compact disks (CDs), digital video disk (DVD), and the like. Additionally, for this example a system bus 320 is used to provide communications links among the various components of the system 300. System bus 320 may be a single bus or a combination of buses. The user interfaces of system 300 may comprise one or more displays 308, one or more speakers 310, and/or a keyboard/controller 322. As earlier stated, one or more of the above-enumerated elements, such as processor 304, may include the evaporator 104 with coolant thermally coupling a compressor 108 of the cooling apparatus 100 described above.

For various embodiments, the system 300 may be a laptop computer, a set-top box, a gaming device, a DVD player, or other similar heat producing devices/systems. By cooling the compressor in manner described, the skin temperatures within the system may be controlled. Further, neighboring components may not substantially heated by the compressor.

Although specific embodiments have been illustrated and described herein, it will be appreciated by those of ordinary skill in the art that any arrangement that is calculated to achieve the same purpose may be substituted for the specific embodiment shown. This application is intended to cover any adaptations or variations of the embodiments of the present invention. Therefore, it is manifestly intended that this invention be limited only by the claims.

What is claimed is:

1. A cooling method comprising:
   providing a coolant to an evaporator thermally coupled to a heat source;

passing the coolant through the evaporator to cool the heat source, with the evaporator operating in an manner that results in the coolant exiting the evaporator in a less than fully vaporous state; and bringing the exiting coolant in the less than fully vaporous state to at least a substantially fully vaporous state prior to entry into a compressor, wherein bringing the coolant exiting the evaporator in the less than fully vaporous state to at least a substantially fully vaporous state comprises bringing the coolant in the less than fully vaporous state to a state selected from the group consisting of a fully vaporous state, a superheated state, and a substantially fully vaporous state.

2. The method of claim 1, wherein said bringing comprises thermally coupling the exiting coolant in the less than fully vaporous state to at least a portion of the compressor to cool the compressor, resulting in the coolant achieving at least a substantially fully vaporous state, and said thermally coupling the exiting coolant in the less than fully vaporous state comprises thermally coupling the exiting coolant in the less than fully vaporous state to one or more portions selected from the group consisting of a portion of a compressor head of the compressor and a portion of a motor of the compressor.

3. The method of claim 1, further comprising passing the coolant in the at least substantially fully vaporous state through the compressor to compress the coolant, and said providing comprises routing the compressed coolant exiting the compressor to the evaporator.

4. The method of claim 1, wherein said heat source is a selected one of an integrated circuit and a peripheral device, and the providing is performed for the selected one.

5. The method of claim 1, wherein the operating of the evaporator in a manner that results in the coolant exiting the evaporator in the less than fully vaporous state comprises operating the evaporator in a manner such that the coolant exiting the evaporator is a selected one from the group consisting of (a) approximately at least 3 percent of the coolant remaining in a non-vaporous state, (b) approximately 3 to approximately 20 percents of the coolant remaining in a non-vaporous state, (c) approximately 5 to approximately 15 percents of the coolant remaining in a non-vaporous state, and (d) approximately 10 percent of the coolant remaining in a non-vaporous state.

6. An apparatus comprising;
a heat source;
an evaporator adapted to be thermally coupled to the heat source to cool the heat source, and configurable to operate in a manner resulting in coolant passing through the evaporator exits in a less than fully vaporous state; and
a compressor configurable to allow thermal coupling of the exiting coolant in the less than fully vaporous state to the compressor to achieve at least a substantially fully vaporous state prior to entry into the compressor, wherein the less than fully vaporous state comprises at least approximately 3 percent of the coolant remaining in a non-vaporous state.

7. The apparatus of claim 6, wherein the thermal coupling comprises one or more thermal couplings with one or more portions selected from the group consisting of a portion of the compressor head of the compressor and a portion of a compressor motor of the compressor.

8. The apparatus of claim 7, wherein the compressor comprises a cold plate, and the thermal coupling comprises routing the coolant in the less than fully vaporous state through the cold plate.

9. The apparatus of claim 8, wherein the cold plate comprises a cooling jacket.

10. The apparatus of claim 6, wherein the coolant achieving at least a substantially fully vaporous state comprises the coolant achieving a fully vaporous state.

11. The apparatus of claim 6, wherein the heat source comprises a source selected from the group consisting of an integrated circuit, a peripheral device, and a power supply.

12. The apparatus of claim 6, wherein the coolant in the less than fully vaporous state comprises approximately 5 to approximately 15 percent of the coolant remaining in a non-vaporous state.

13. An system comprising:
a processor;
an evaporator adapted to be thermally coupled to a processor to cool the processor, and configurable to operate in a manner resulting in coolant passing through the evaporator exits in a less than fully vaporous state;
a disk storage coupled to the processor; and
a compressor configurable to allow the exiting coolant in the less than fully vaporous state to be thermally coupled to the compressor to achieve at least a substantially fully vaporous state.

14. The system of claim 13, wherein the thermal coupling comprises one or more thermal couplings with one or more portions selected from the group consisting of a portion of a compressor head of the compressor and a portion of a compressor motor of the compressor.

15. The system of claim 13, wherein the compressor comprises a cold plate, and the thermal coupling of the exiting coolant with the compressor comprises routing the coolant in the less than fully vaporous state through the cold plate.

16. The system of claim 13, wherein the coolant in the substantially fully vaporous state comprises the coolant being in a fully vaporous state.

17. The system of claim 13, wherein the system is a selected one from the group comprising a laptop computer, a set-top box, a gaming device, and a DVD player.

* * * * *

UNITED STATES PATENT AND TRADEMARK OFFICE
CERTIFICATE OF CORRECTION

| | | |
|---|---|---|
| PATENT NO. | : 7,559,210 B2 | Page 1 of 1 |
| APPLICATION NO. | : 11/171884 | |
| DATED | : July 14, 2009 | |
| INVENTOR(S) | : Rajiv K. Mongia | |

It is certified that error appears in the above-identified patent and that said Letters Patent is hereby corrected as shown below:

Fig. 1
112 Condesor should be 112 Condenser

Column 5
Line 39, "5. ...20 percents..." should read --5. ...20 percent...--.
Lines 40-41, "5. ...15 percents..." should read --5. ...15 percent...--.
Line 44, "6. ...comprising;..." should read --6. ...comprising:...--.

Column 6
Lines 26, "13. An system comprising:..." should read --13. A system comprising:...--.

Signed and Sealed this
Twelfth Day of July, 2011

David J. Kappos
*Director of the United States Patent and Trademark Office*